United States Patent [19]

Bahlinger

[11] Patent Number: 4,459,654
[45] Date of Patent: Jul. 10, 1984

[54] HIGH-VOLTAGE RECTIFIER

[75] Inventor: Walter Bahlinger, Munich, Fed. Rep. of Germany

[73] Assignee: Siemens Aktiengesellschaft, Berlin and Munich, Fed. Rep. of Germany

[21] Appl. No.: 402,842

[22] Filed: Jul. 29, 1982

[30] Foreign Application Priority Data

Aug. 19, 1981 [DE] Fed. Rep. of Germany ....... 3132791

[51] Int. Cl.$^3$ ............................................. H01L 25/02
[52] U.S. Cl. ...................................... 363/141; 357/82; 361/388
[58] Field of Search .................... 363/68, 141, 144; 361/388; 357/76, 82

[56] References Cited

U.S. PATENT DOCUMENTS 3,309,578  3/1967  Diebold ............................. 361/388
3,398,349  8/1968  Evans, Jr. et al. ................. 363/141
3,739,209  6/1973  Drabik ............................... 363/141
3,848,174  11/1974 Thompson et al. .................. 363/68

FOREIGN PATENT DOCUMENTS 2342772 12/1974 Fed. Rep. of Germany .

Primary Examiner—William H. Beha, Jr.
Attorney, Agent, or Firm—Herbert L. Lerner; Laurence A. Greenberg

[57] ABSTRACT

High-voltage rectifier having a plurality of serially connected semiconductor components, including a substantially cylindrical shielding formed of a plurality of sections electrically isolated from one another, each of the sections containing at least one of the semiconductor components, the shielding sections being formed as cooling bodies defined at one side thereof by a cylinder-segment surface, at least two of the cooling bodies forming a group and being disposed in spaced relationship to one another in a common plane so that the cylinder-segment surfaces thereof define a nearly complete cylinder, the cooling bodies having cooling ribs at a side thereof opposite the respective cylinder-segment surfaces thereof, the respective semiconductor components being connected thermally and electrically conductively to the respective opposite sides of the cooling bodies.

4 Claims, 3 Drawing Figures

HIGH-VOLTAGE RECTIFIER

SPECIFICATION

The invention relates to a high-voltage rectifier and, more particularly, to such a rectifier having a plurality of serially connected semiconductor components and a substantially cylindrical shielding formed of a plurality of sections which are electrically isolated from one another, each of the sections containing at least one of the semiconductor components.

A high-voltage rectifier of this general type has been described in German Published Non-Prosecuted Application (DE-OS) No. 23 42 772, corresponding to U.S. Pat. No. 3,848,174 for example. The semiconductor components are located in the interior of the shielding means in this heretofore known rectifier, and are mounted or assembled therein on special supports or carriers. This heretofore known high-voltage rectifier is designed for relatively small currents, so that no special measures for cooling are required. For higher currents, however, the semiconductor components must generally be cooled by cooling bodies.

It is accordingly an object of the invention to provide a high-voltage rectifier which can be used economically also for higher-power semiconductor components.

With the foregoing and other objects in view, there is provided, in accordance with the invention, a high-voltage rectifier having a plurality of serially connected semiconductor components, comprising a substantially cylindrical shielding formed of a plurality of sections electrically isolated from one another, each of the sections containing at least one of the semiconductor components, the shielding sections being formed as cooling bodies defined at one side thereof by a cylinder-segment surface, at least two of the cooling bodies forming a group and being disposed in spaced relationship to one another in a common plane so that the cylinder-segment surfaces thereof define a nearly complete cylinder, the cooling bodies having cooling ribs at a side thereof opposite the respective cylinder-segment surfaces thereof, the respective semiconductor components being connected thermally and electrically conductively to the respective opposite sides of the cooling bodies.

In accordance with another feature of the invention, the cooling bodies are formed with a respective recess on the sides thereof having the cooling ribs, and including an insulating body fastened in the recess and mechanically connecting the cooling bodies to one another.

In accordance with a further feature of the invention, the insulating body is a bar whereon a plurality of the groups of cooling bodies are fastened in spaced relationship to one another.

In accordance with a concomitant feature of the invention, there are provided conductors disposed within the cylinder surfaces and electrically connecting the semiconductor components of the groups of cooling bodies to one another.

Other features which are considered as characteristic for the invention are set forth in the appended claims.

Although the invention is illustrated and described herein as embodied in a high-voltage rectifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
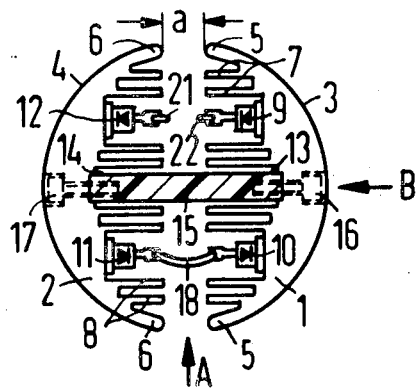
FIG. 1 is a diagrammatic cross-sectional view taken along the line I—I in FIG. 2 of a high-voltage rectifier according to the invention.

Like parts are identified by the same reference characters in all of the figures. Referring now specifically to the drawing and first, particularly to FIG. 1 thereof, there are shown two cooling bodies (heat sinks) 1 and 2 which are disposed opposite one another in one and the same plane. The cooling bodies or heat sinks 1 and 2 are limited externally by cylinder-segment surfaces 3 and 4, each encompassing nearly half a cylinder, respectively. The cooling bodies are assembled in spaced relationship to one another, and together form an almost completely closed cylinder. "Almost completely closed" means in this context that the surface is interrupted only as much as is required for electric isolation of the cooling bodies 1 and 2 which lie at different potentials. On the sides of the cooling bodies 1 and 2 disposed opposite the cylinder-segment surfaces 3 and 4, cooling ribs 7 and 8, respectively, are provided. The farthest radially-outwardly disposed ribs 5 and 6, respectively, are rounded at the ends thereof in a manner that no spark or discharge phenomena occur when the operating voltage is applied. Semiconductor components 9 and 10 as well as 11 and 12, respectively, are connected electrically and thermally conductively to the respective side of the cooling bodies carrying the cooling ribs. The semiconductor components are diodes or thyristors, for example. The sides of the cooling bodies carrying the cooling ribs are provided with a respective recess 13 and 14 into which an isolation member such as a bar 15, for example, extends. Both cooling bodies are fastened to the bar 15 with screws 16 and 17, respectively.

Figure 2:
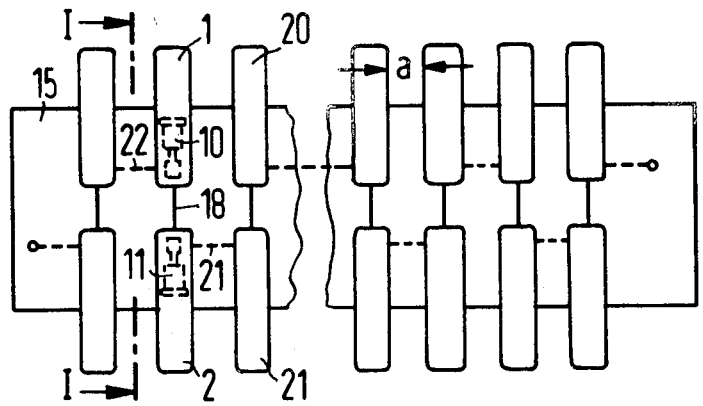
FIG. 2 is a longitudinal view of the high-voltage rectifier as seen in direction of the arrow A of FIG. 1 rotated through an angle of 90°.
Figure 3:
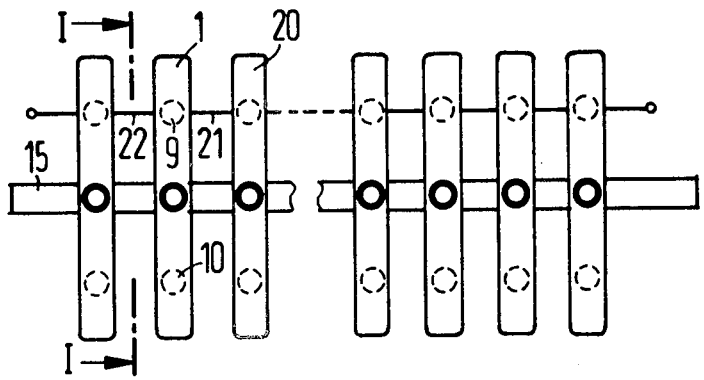
FIG. 3 is a longitudinal view of the high-voltage rectifier as seen in direction of the arrow B of FIG. 1.

As is apparent in FIGS. 2 and 3, depending upon the level of voltage which is to be rectified, several groups of cooling bodies are disposed on the bar 15. Two additional cooling bodies of those belonging to one group are identified by reference numerals 20 ans 21. The semiconductor components of each group are connected electrically in series. The diodes of the preceding group are then connected in series with those of the following group. The semiconductor components 10 and 22 are connected by a line or lead 18, while the semiconductor components 9 and 10, on the one hand, and 11 and 12, on the other hand, are connected through the respective cooling bodies 1 and 2, themselves. The groups are then, in turn, connected to one another by the lines 21 and 22. It is apparent that the semiconductor components entirely and the lines or leads at least partly are located within the cylinder formed by the surfaces 3 and 4. The mutual spacing of the individual groups of cooling bodies is governed also by the level of the operating voltage. It may therefore also be the distance "a". The shielding capability of the cooling bodies is not affected by the interruption formed by the spacing "a"; the cooling bodies act like a "Faraday Cage".

It was shown in FIG. 1 that a group of cooling bodies arranged in one and the same plane is formed of two cooling bodies. However, it is also possible to arrange several, such as three of four cooling bodies, for example, in one and the same plane in such a manner that the cylinder-segment surfaces thereof form almost a complete cylinder. These three of four cooling bodies are then connected mechanically to one another by suitably shaped bars.

The foregoing is a description corresponding to German Application No. P 31 32 791.5, dated Aug. 19, 1981, the International priority of which is being claimed for the instant application, and which is hereby made part of this application. Any discrepancies between the foregoing specification and the corresponding German application are to be resolved in favor of the latter.

I claim:

1. High-voltage rectifier having a plurality of serially connected semiconductor components, comprising a substantially cylindrical shielding formed of a plurality of sections electrically isolated from one another, each of said sections containing at least one of the semiconductor components, said shielding sections being formed as cooling bodies defined at one side thereof by a cylinder-segment surface, at least two of said cooling bodies forming a group and being disposed in spaced relationship to one another in a common plane so that said cylinder-segment surfaces thereof define a nearly complete cylinder, said cooling bodies having cooling ribs at a side thereof opposite the respective cylinder-segment surfaces thereof, the respective semiconductor components being connected thermally and electrically conductively to the respective opposite sides of said cooling bodies.

2. High-voltage rectifier according to claim 1 wherein said cooling bodies are formed with a respective recess on said sides thereof having said cooling ribs, and including an insulating body fastened in said recess and mechanically connecting said cooling bodies to one another.

3. High-voltage rectifier according to claim 2 wherein said insulating body is a bar whereon a plurality of said groups of cooling bodies are fastened in spaced relationship to one another.

4. High-voltage rectifier according to claim 3 including conductors disposed within said cylinder surfaces and electrically connecting the semiconductor components of said groups of cooling bodies to one another.

* * * * *